(12) United States Patent
Lv (10) Patent No.: US 12,232,294 B2
(45) Date of Patent: Feb. 18, 2025

(54) FAN FREE SUPPORT FREE OF ASSEMBLY AND DISASSEMBLY TOOLS

(71) Applicant: SUZHOU METABRAIN INTELLIGENT TECHNOLOGY CO., LTD., Jiangsu (CN)

(72) Inventor: Heng Lv, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/718,141

(22) PCT Filed: Dec. 16, 2022

(86) PCT No.: PCT/CN2022/139723
§ 371 (c)(1),
(2) Date: Jun. 10, 2024

(87) PCT Pub. No.: WO2023/185108
PCT Pub. Date: Oct. 5, 2023

(65) Prior Publication Data
US 2024/0422937 A1  Dec. 19, 2024

(30) Foreign Application Priority Data
Mar. 29, 2022 (CN) .......................... 202210316892.0

(51) Int. Cl.
*H05K 7/20* (2006.01)
*G06F 1/20* (2006.01)
(52) U.S. Cl.
CPC .......... *H05K 7/20172* (2013.01); *G06F 1/20* (2013.01); *H05K 7/20727* (2013.01)
(58) Field of Classification Search
CPC .. H05K 7/20172; H05K 7/20721; G06F 1/20; F16M 11/00
See application file for complete search history.

(56) References Cited

U.S. PATENT DOCUMENTS 6,183,214 B1 * 2/2001 Ko .................. F04D 29/601
417/423.15
6,244,953 B1 * 6/2001 Dugan ............... H05K 7/20172
361/695

(Continued)

FOREIGN PATENT DOCUMENTS

CN    103970225 A    8/2014
CN    108980078 A   12/2018
(Continued)

OTHER PUBLICATIONS

International Search report for PCT/CN2022/139723 mailed on Mar. 9, 2023.

*Primary Examiner* — Monica E Millner
(74) *Attorney, Agent, or Firm* — Dennemeyer & Associates LLC (57) ABSTRACT

Disclosed is a fan support free of assembly and disassembly tools. The fan support includes: left-right symmetrical slots, provided on a server case base and respectively located on both sides of a fan; an elastic arm assembly, including two symmetrical side arms and an elastic member, bottoms of the two side arms are snap-fitted in the two slots, and tops of the two side arms are connected by the elastic member; a fixing assembly, provided with a limiting structure that fits with a fan housing, and a sliding groove; a pressing assembly, provided with a deformable region, and a sliding structure that fits with the sliding groove, the deformable region is configured to drive the sliding structure to move outwards, the sliding structure pushes the elastic member to stretch and deform to drive the two side arms to disengage from the two slots.

20 Claims, 10 Drawing Sheets

(56) References Cited

U.S. PATENT DOCUMENTS

| | | | | |
|---|---|---|---|---|
| 6,493,225 B2* | 12/2002 | Chuang | ............. | H05K 7/20172 |
| | | | | 415/176 |
| 6,711,013 B2* | 3/2004 | Wobig | ................. | H01L 23/467 |
| | | | | 361/679.48 |
| 7,245,490 B2* | 7/2007 | Chou | ..................... | G06F 1/183 |
| | | | | 361/695 |
| 8,300,411 B2* | 10/2012 | Tang | ................. | H05K 7/20172 |
| | | | | 415/214.1 |
| 2006/0120040 A1* | 6/2006 | Chen | ................. | H05K 7/20172 |
| | | | | 361/695 |
| 2012/0067554 A1* | 3/2012 | Chen | ................. | F28D 15/0275 |
| | | | | 165/138 |
| 2012/0318953 A1* | 12/2012 | Tsai | ................. | H05K 7/20172 |
| | | | | 248/680 |
| 2013/0256501 A1* | 10/2013 | He | ..................... | H05K 7/20172 |
| | | | | 248/674 |
| 2014/0023494 A1* | 1/2014 | Li | ........................ | F04D 29/601 |
| | | | | 415/213.1 |
| 2014/0027604 A1 | 1/2014 | Gong | | |
| 2014/0055952 A1* | 2/2014 | Sun | ................... | H05K 7/20727 |
| | | | | 361/695 |

FOREIGN PATENT DOCUMENTS

| | | | |
|---|---|---|---|
| CN | 208459937 U | 2/2019 | |
| CN | 112943648 A | 6/2021 | |
| CN | 214427892 U | 10/2021 | |
| CN | 114415809 A | 4/2022 | |

* cited by examiner

FAN FREE SUPPORT FREE OF ASSEMBLY AND DISASSEMBLY TOOLS

CROSS-REFERENCE TO RELATED APPLICATIONS

This is a 35 U.S.C. 371 National Stage Patent Application of International Application No. PCT/CN2022/139723, filed Dec. 16, 2022, which claims priority to Chinese application 202210316892.0, filed Mar. 29, 2022, each of which is hereby incorporated by reference in its entirety.

TECHNICAL FIELD

The present disclosure relates to the technical field of server heat dissipation, and in particular, to a fan support free of assembly and disassembly tools.

BACKGROUND

With the continuous development of science and technology, people's demand for the computing power of computers is also increasing, and in order to meet the demand for processing massive amounts of data, server systems emerge as required. At the same time, with the arrival of big data and artificial intelligence era, computational tasks for servers have increased exponentially. As a server may emit a large amount of heat when operating, an array composed of a plurality of cooling fans is required to operate uninterruptedly, so as to ensure that a server unit is in a normal temperature range, thereby ensuring the normal operation of the server.

Currently, most existing servers use metal supports, fan rivets, or blind rivets to fix the servers. The existing fan fixing method has the following disadvantages: on the one hand, metal supports commonly fix the fans in rows, and when one of the supports needs to be replaced, the whole support needs to be completely disassembled, for example, a large number of rivets need to be disassembled by using a disassembling tool, making the process cumbersome and time-consuming; on the other hand, the large volume of existing fan supports may obstruct some airflow, limiting the fans' ability to fully dissipate heat.

SUMMARY

In view of the above, some embodiments of the present disclosure provide a fan support free of assembly and disassembly tools for the technical problem above, including:

a slot, there are two left-right symmetrical slots, and the two slots are both provided on a server case base, and the two slots are respectively located on left and right sides of a fan;

an elastic arm assembly, the elastic arm assembly includes two side arms which are left-right symmetrical and vertically arranged, and an elastic member, the two side arms are respectively located on left and right sides of the fan, bottoms of the two side arms are bent inwards to form bending regions, the two bending regions are respectively snap-fitted in two slots, tops of the two side arms are connected by the elastic member;

a fixing assembly, the fixing assembly is provided with a limiting structure that fits with a mounting through hole on a top of a fan housing, and the fixing assembly is further provided with a sliding groove along a width direction of the fan; and a pressing assembly, the pressing assembly is provided with a deformable region, and a sliding structure that fits with the sliding groove, the deformable region is configured to drive the sliding structure to move outwards in the sliding groove in respond to being subjected to an external force, and the sliding structure pushes the elastic member to stretch and deform, so that a distance between the two side arms increases to drive the bending regions of the two side arms to disengage from the two slots.

In some embodiments, each of the two slots includes a rectangular through hole provided on the server case base, a baffle is provided on an inner side of the rectangular through hole, and the baffle is bent towards a side where the fan is located to cover the rectangular through hole.

In some embodiments, each of the two side arms includes a vertical rod, a snap fit member, and a horizontal rod; and the vertical rod is arranged along the vertical direction, the snap fit member is fixed on an inner side of a bottom of the vertical rod, and the horizontal rod is fixed on an inner side of a top of the vertical rod and extends along the width direction of the fan.

In some embodiments, a first connecting rod located in a middle and two second connecting rods located on both sides are arranged side by side on an end portion of the horizontal rod away from the vertical rod, a mounting pin is fixed on an end portion of the first connecting rod, and each end of the elastic member is fixed on the mounting pin corresponding to the horizontal rod of each of the two side arms.

In some embodiments, the fixing assembly includes two fixing supports having the same structure;

Each of the two fixing supports includes a side plate and a top plate which are perpendicular to each other, a lower portion of the side plate is provided with an arcuate notch, a release pin movable groove along the width direction of the fan is provided above the arcuate notch on the side plate, limiting posts are fixed on the same side of the side plate as the top plate and located on both sides of the arcuate notch, and each of the limiting posts is inserted into the mounting through hole on the top of the fan housing; and sides of the two fixing supports with the limiting posts are arranged opposite each other, both ends of the top plate are respectively provided with a first elastic slot and a first elastic snap fit member, and the first elastic snap fit member of one of the two fixing supports is snap-fitted in the first elastic slot of the other of the two fixing supports.

In some embodiments, each of the two fixing supports further includes two guide plates arranged symmetrically on left and right sides, the two guide plates are fixed on the side plate and are parallel to the top plate, a side edge of the horizontal rod is embedded between the two guide plates and the top plate, and a front end of the first connecting rod is bent downwards to form a limiting block;

a lower edge of a side, away from the side plate, of one of the two guide plates is provided with an alignment groove recessed relative to an edge of one of the two guide plates, an alignment pin protruding relative to the edge of one of the two guide plates is arranged above the alignment groove, an upper edge of a side, away from the side plate, of the other of the two guide plates is provided with the alignment groove recessed relative to an edge of the other of the two guide plates, and the alignment pin protruding relative to the edge of the other of the two guide plates is provided below the alignment groove, and the alignment pin and the alignment groove have the same length and width.

In some embodiments, the pressing assembly includes two elastic pressing pieces having the same structure;

Each of the two elastic pressing pieces includes an elastic curved surface which is bent towards the vertical direction, a first support frame and a second support frame are respectively fixed on two opposite ends of the elastic curved surface, the horizontal rod is provided with a first mounting groove for mounting the first support frame or the second support frame, the top plate is provided with two second mounting grooves for mounting the first support frame and the second support frame, and release pins are fixed on both of the first support frame and the second support frame; and sides of the two elastic pressing pieces with the release pins are provided opposite each other, and each of the release pins is inserted into the release pin movable groove, in respond to the elastic curved surfaces being pressed, the release pins abut against one of the two second connecting rods on an end portion of the horizontal rod.

In some embodiments, the first support frame is provided with a second elastic snap fit member, the second support frame is provided with a second elastic slot, and the second elastic snap fit member of one of the two elastic pressing pieces is snap-fitted in the second elastic slot of the other of the two elastic pressing pieces.

In some embodiments, the elastic member is a compression spring.

In some embodiments, the fan support further includes a rubber pad, the rubber pad is arranged at a position where the fan is in contact with the server case base, and the rubber pad is fixed to a bottom of the fan housing or the bottom of the server case base.

The fan support free of assembly and disassembly tools has at least the following beneficial technical effects: eliminating the need for large metal supports and blind rivets assembly, thereby reducing costs; facilitating easy mounting and removal without the requirement for assembly and disassembly tools; requiring a small operational space; maintaining a simple structure and compact volume without obstructing airflow; ensuring independent fixation of each fan; facilitating maintenance, and reducing labor costs; and exhibiting high versatility.

BRIEF DESCRIPTION OF THE DRAWINGS

To describe the technical solutions in the embodiments of the present disclosure or in the related art more clearly, the following briefly introduces the accompanying drawings required for describing the embodiments or the related art. Apparently, the accompanying drawings in the following description show merely some embodiments of the present disclosure, and a person skilled in the art may still derive other embodiments from these accompanying drawings without creative efforts.

EXPLANATION OF REFERENCE SIGNS

100: server case base; 110: slot; 111: rectangular through hole; 112: baffle;
200: fan; 210: mounting through hole;
300: elastic arm assembly; 310: side arm; 320: elastic member;
311: vertical rod; 312: snap fit member; 313: horizontal rod; 3131: first connecting rod; 3132: second connecting rod; 3133: mounting pin; 3134: limiting block; 314: first mounting groove; 315: handle;
400: fixing assembly; 410: fixing support;
411: side plate; 4111: arcuate notch; 412: top plate; 4121: first elastic snap-fit groove; 4122: first elastic snap fit member; 413: release pin movable groove; 414: limiting post; 415: guide plate; 4151: alignment groove; 4152: alignment pin; 416: second mounting groove;
500: pressing assembly; 510: elastic pressing piece;

511: elastic curved surface; 512: first support frame; 5121: second elastic snap fit member; 513: second support frame; 5131: second elastic snap-fit groove; 514: release pin;

600: rubber pad.

DETAILED DESCRIPTION OF THE EMBODIMENTS

In order to make the objects, technical solutions and advantages of the present disclosure more apparent, the embodiments of the present disclosure will be further described in detail below in conjunction with specific embodiments and with reference to the accompanying drawings.

In the description of the present disclosure, it should be understood that the orientations or positional relationships indicated by the terms such as "center", "longitudinal", "transverse", "length", "width", "thickness", "upper", "lower", "front", "back", "left", "right", "vertical", "horizontal", "top", "bottom", "inner", "outer", "clockwise", and "counterclockwise" are based on the orientations or positional relationships shown in the drawings. These terms are only for the convenience of describing the present disclosure and simplifying the description, rather than indicating or implying that the device or element referred to must have a particular orientation, be constructed and operated in a particular orientation, and thus cannot be understood as limitations to the present disclosure.

In addition, the terms "first" and "second" are only used for description purposes and cannot be understood as indicating or implying relative importance or implicitly indicating the number of the indicated technical features. Thus, the features defined by "first" and "second" may explicitly or implicitly include one or more features. In the description of the present disclosure, the term "a plurality of" means two or more, unless specifically defined otherwise. In addition, the terms "mount", "connect", and "connection" should be understood broadly, for example, may refer to a fixed connection, may also refer to a detachable connection, or may refer to an integrated connection; may refer to a mechanical connection, may also refer to an electrical connection; may refer to a direct connection, may also refer to an indirect connection via an intermediate medium, and may refer to the internal communication of two elements. The specific meanings of the described terms in the present disclosure can be understood by a person skilled in the art according to specific situations.

Figure 1:
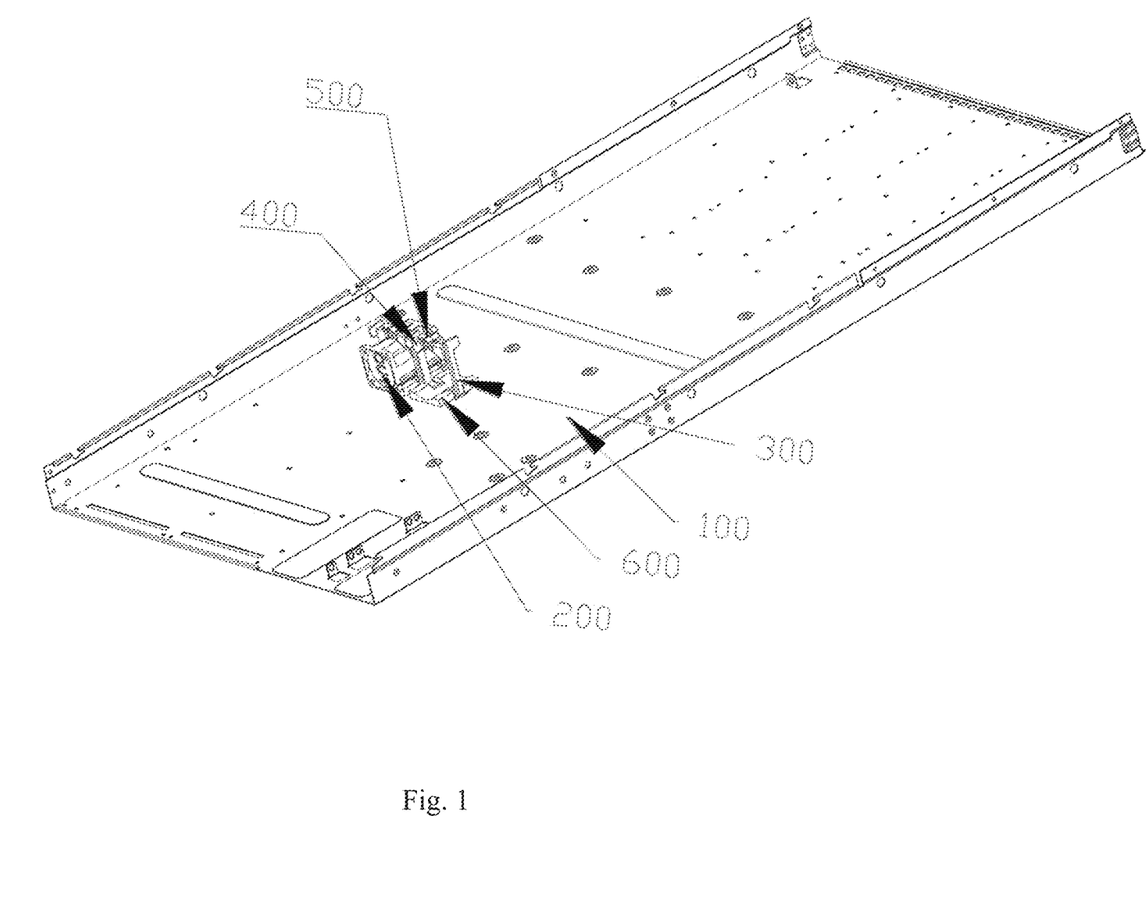
FIG. 1 is a three-dimensional view of a fan support free of assembly and disassembly tools according to an embodiment of the present disclosure.
Figure 2:
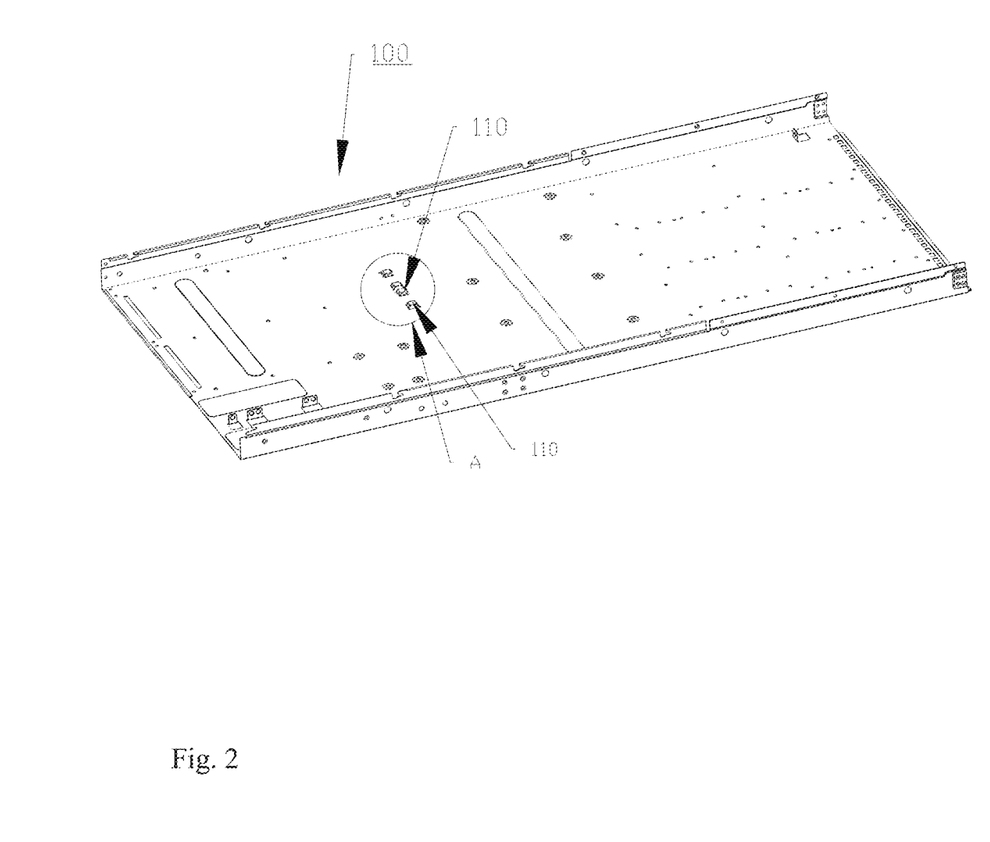
FIG. 2 is a three-dimensional view of a server case base according to an embodiment of the present disclosure.

In some embodiments, as shown in FIGS. 1-2, the present disclosure provides a fan support free of assembly and disassembly tools. The fan support includes:
- a slot 110, and there are two left-right symmetrical slots 110, the two slots 110 are both provided on a server case base 100, and the two slots 110 are respectively located on left and right sides of a fan 200; and
- an elastic arm assembly 300, the elastic arm assembly 300 includes two side arms 310 which are left-right symmetrical and vertically arranged, and an elastic member 320, the two side arms 310 are respectively located on left and right sides of the fan 200, bottoms of the two side arms 310 are bent inwards to form bending regions, the two bending regions are respectively snap-fitted in the two slots 110, tops of the two side arms 310 are connected by the elastic member 320, and the elastic member 320 is a belt, a spring, and so on, and in an embodiment, a compression spring is adopted as the elastic element 320, and in a normal state, the compression spring is able to cause the two side arms 310 of the elastic arm assembly 300 to automatically move inwards, thereby securing the fan 200 in place;
- a fixing assembly 400, the fixing assembly 400 is provided with a limiting structure that fits with a mounting through hole 210 on a top of a fan housing, and the fixing assembly 400 is further provided with a sliding groove along a width direction of the fan; and
- a pressing assembly 500, the pressing assembly 500 is provided with a deformable region, and a sliding structure that fits with the sliding groove, the deformable regions are configured to drive the sliding structure to move outwards in the sliding groove in respond to being subjected to an external force, and the sliding structure pushes the elastic member 320 to stretch and deform, so that a distance between the two side arms 310 increases to drive the bending regions of the two side arms 310 to disengage from the two slots 110.

The fan support free of assembly and disassembly tools has at least the following beneficial technical effects: eliminating the need for large metal supports and blind rivets assembly, thereby reducing costs; facilitating easy mounting and removal without the requirement for assembly and disassembly tools; requiring a small operational space; maintaining a simple structure and compact volume without obstructing airflow; ensuring independent fixation of each fan; facilitating maintenance, and reducing labor costs; and exhibiting high versatility.

Figure 3:
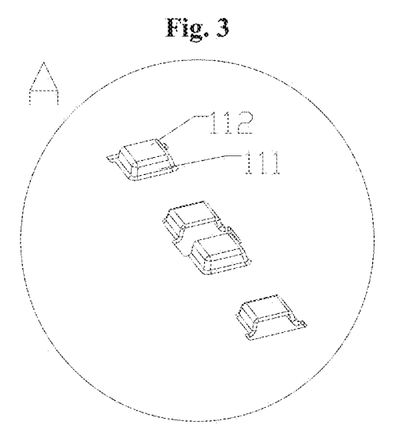
FIG. 3 is a partially enlarged view of a region A in FIG. 2.

In some embodiments, as shown in FIGS. 2-3, each of the two slots 110 includes a rectangular through hole 111 provided on the server case base 100, a baffle 112 is provided on an inner side of the rectangular through hole 111, and the baffle 112 is bent towards a side where the fan 200 is located to cover the rectangular through hole 111.

In the embodiments, by adopting the slots 110 having the described structure, the two side arms 310 are firmly snap fitted in the server case base 100, and the fan 200 is not easily disengaged.

Figure 4:
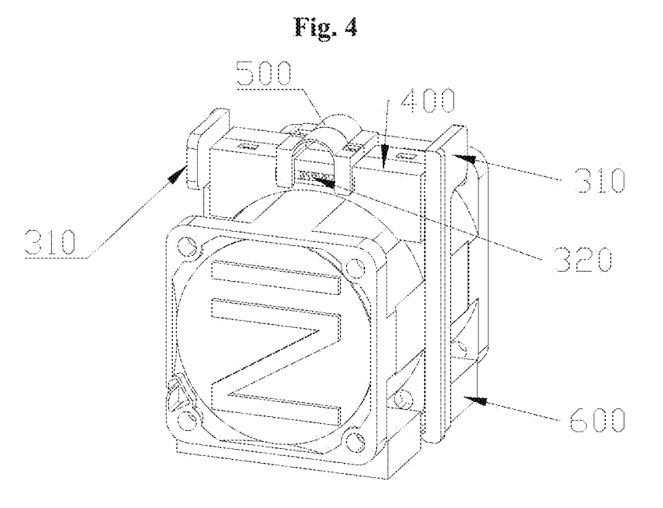
FIG. 4 is a three-dimensional view of a fan support according to an embodiment of the present disclosure, with the server case base concealed.
Figure 5:
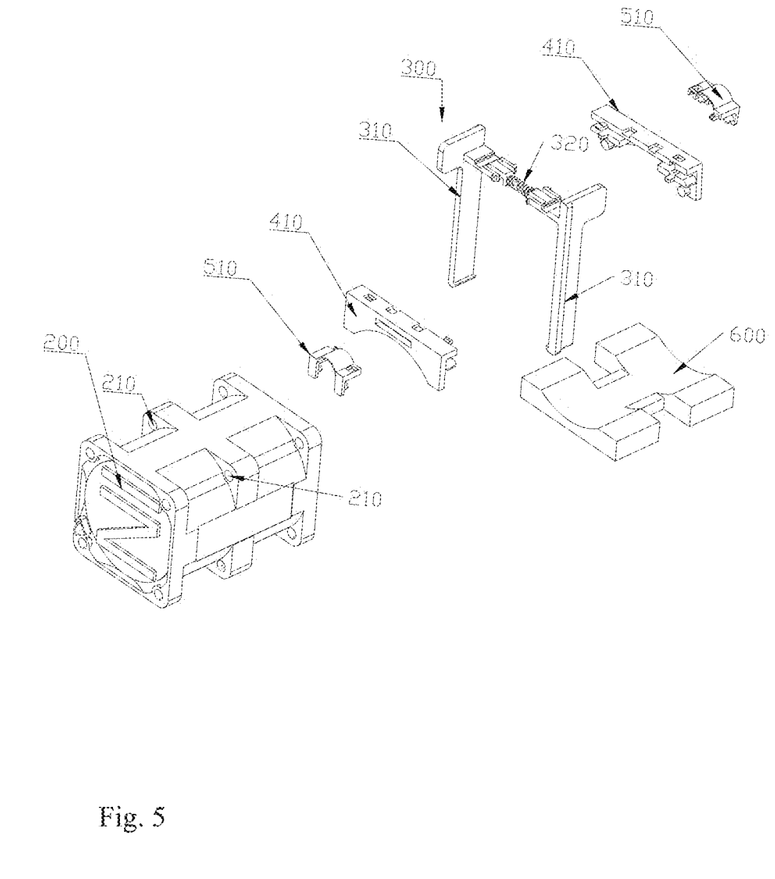
FIG. 5 is an exploded view of FIG. 4.

It should be noted that, in order to facilitate understanding of the technical solution of the present disclosure, taking one of the fans as an example, the three-dimensional view of a fan support removed from the server case base as a whole is as shown in FIG. 4, and the parts in FIG. 4 are further disassembled to obtain FIG. 5. The specific structures of the parts in FIG. 5 will be described in detail below.

Figure 6:
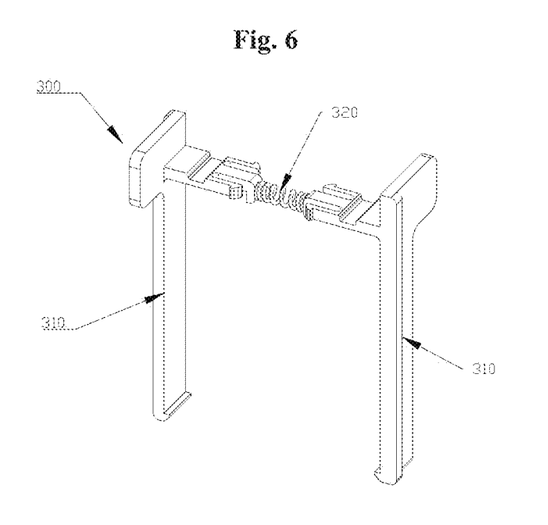
FIG. 6 is a top three-dimensional view of an elastic arm assembly according to an embodiment of the present disclosure.
Figure 7:
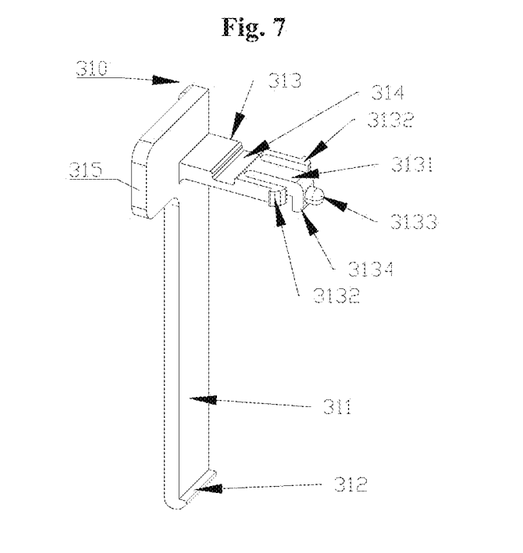
FIG. 7 is a three-dimensional view of a side arm according to an embodiment of the present disclosure.

In some embodiments, with further reference to FIGS. 6-7, each of the two side arms 310 includes a vertical rod 311, a snap fit member 312, and a horizontal rod 313; and the vertical rod 311 is arranged along the vertical direction, the snap fit member 312 is fixed on an inner side of a bottom of the vertical rod 311, and the horizontal rod 313 is fixed on an inner side of a top of the vertical rod 311 and extends along the width direction of the fan 200.

Figure 8:
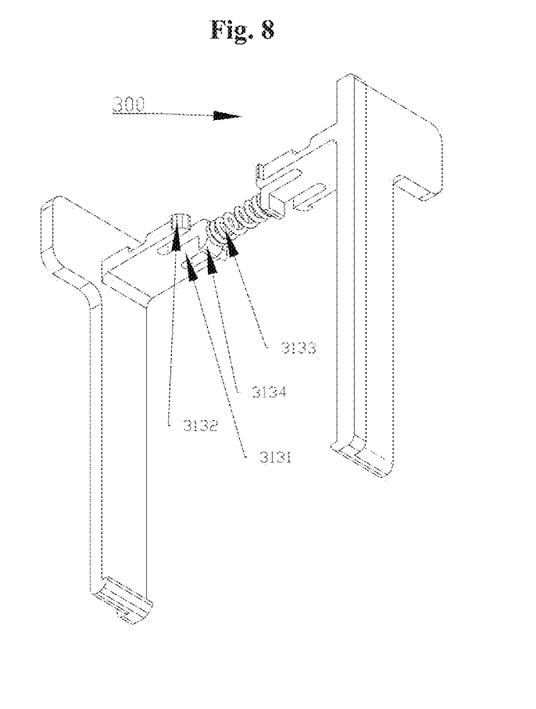
FIG. 8 is a bottom three-dimensional view of an elastic arm assembly according to an embodiment of the present disclosure.

In some embodiments, as shown in FIGS. 7-8, a first connecting rod 3131 located in a middle and two second connecting rods 3132 located on both sides are arranged side by side on an end portion of the horizontal rod 313 away from the vertical rod 311; a mounting pin 3133 is fixed on an end portion of the first connecting rod 3131; and each end of the elastic member 320 is fixed on the mounting pin 3133 corresponding to the horizontal rod 313 of each of the two side arms 310.

In an embodiment, in order to facilitate returning and snap-fitting of the two side arms 310 into the two slots 110, in a specific implementation process, a handle 315 is mounted on an upper portion of the vertical rod 311 and when it is required to mount a fan support to the server case base 100, an operator simply needs to press the two handles 315 inwardly to return the two side arms 310 to their original positions.

In the embodiment, by adopting the side arms 310 having the described structure make a connection between the two sides stable, and reserved end portions of the four second connecting rods 3132 provide assurance for the subsequent stable pushing of the two side arms 310.

Figure 9:
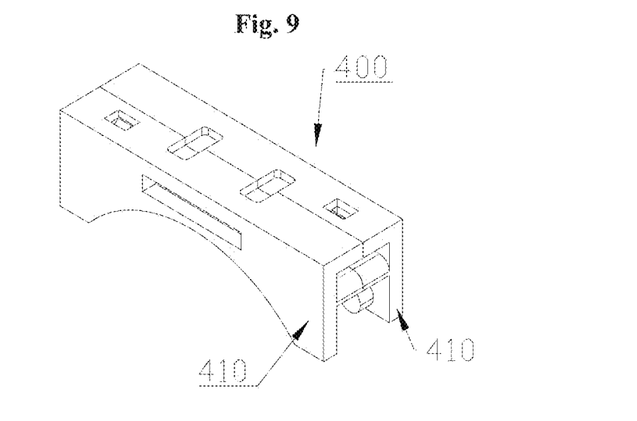
FIG. 9 is a top three-dimensional view of a fixing assembly according to an embodiment of the present disclosure.
Figure 10:
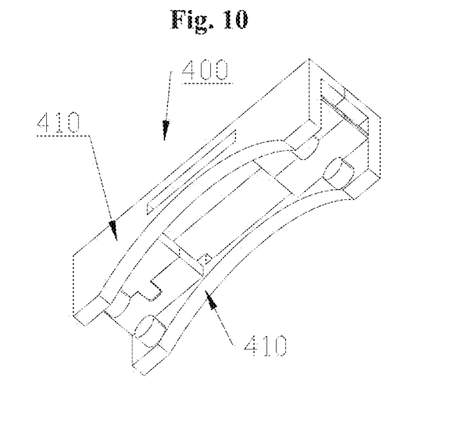
FIG. 10 is a bottom three-dimensional view of a fixing assembly according to an embodiment of the present disclosure.
Figure 11:
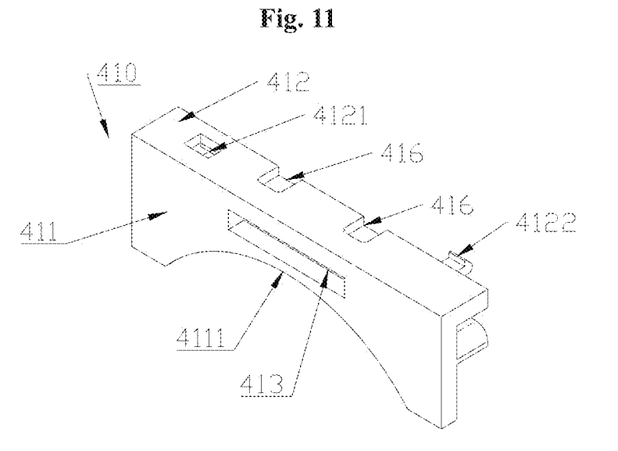
FIG. 11 is a top outer three-dimensional view of a fixing support according to an embodiment of the present disclosure.

In some embodiments, as shown in FIGS. 9-11, the fixing assembly 400 includes two fixing supports 410 having the same structure.

Each of the two fixing supports 410 includes a side plate 411 and a top plate 412 which are perpendicular to each other; a lower portion of the side plate 411 is provided with an arcuate notch 4111; a release pin movable groove 413 along the width direction of the fan 200 is provided above the arcuate notch 4111 on the side plate 411; limiting posts 414 are fixed on the same side of the side plate 411 as the top plate 412 and located on both sides of the arcuate notch 4111; and each of the limiting posts 414 is inserted into the mounting through hole 210 on the top of the fan housing.

Sides of the two fixing supports 410 with the limiting posts 414 are arranged opposite each other, both ends of the top plate 412 are respectively provided with a first elastic slot 4121 and a first elastic snap fit member 4122, and the first elastic snap fit member 4122 of one of the two fixing supports 410 is snap-fitted in the first elastic slot 4121 of the other of the two fixing supports 410.

In the embodiment, two fixing supports 410 arranged symmetrically are adopted in the fixing assembly 400, so that the fan 200 is fixed more stably, and the internal arcuate notch 4111 also ensures that the elastic member 320 moves more smoothly.

Figure 12:
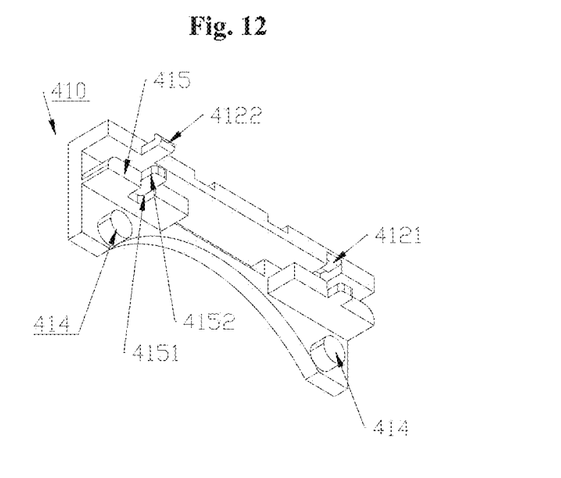
FIG. 12 is a bottom inner three-dimensional view of a fixing support according to an embodiment of the present disclosure.
Figure 13:
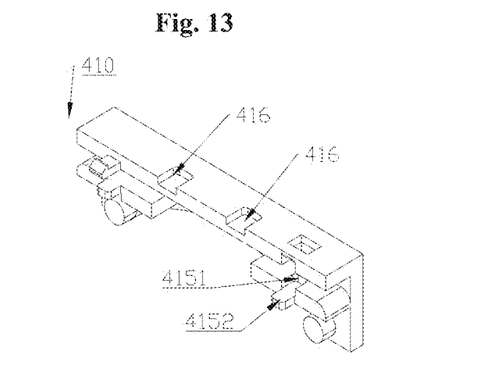
FIG. 13 is a top inner three-dimensional view of a fixing support according to an embodiment of the present disclosure.

In some embodiments, as shown in FIGS. 12-13, each of the fixing supports 410 further includes two guide plates 415 arranged symmetrically on left and right sides, the two guide plates 415 are fixed on the side plate 411 and are parallel to the top plate 412, a side edge of the horizontal rod 313 is embedded between the two guide plates 415 and the top plate 412, and a front end of the first connecting rod 3131 is bent downwards to form a limiting block 3134.

A lower edge of a side, away from the side plate 411, of one of the two guide plates 415 is provided with an alignment groove 4151 recessed relative to an edge of one of the two guide plates, an alignment pin 4152 protruding relative to the edge of one of the two the guide plates is provided above the alignment groove 4151; an upper edge of a side, away from the side plate 411, of the other of the two guide plates 415 is provided with the alignment groove 4151 recessed relative to an edge of the other of the two guide plates, and the alignment pin 4152 protruding relative to the edge of the other of the two guide plates is provided below the alignment groove 4151; and the alignment pins 4152 and the alignment grooves 4151 have the same length and width.

In the embodiment, the two guide plates 415 are arranged in the two fixing supports 410 to ensure that the horizontal rod 313 moves along the two guide plates 415, facilitating a pushing out and snap fitting of the two side arms 310. Moreover, a maximum stretch distance of the elastic member 320 is limited by the limiting block 3134 to prevent the horizontal rod 313 from falling off the two guide plates 415 due to excessive pressure, so that the fan support is more stable; in addition, the alignment pin 4152 and the alignment groove 4151 arranged in a staggered manner on the two guide plates 415 allow the operator to accurately fix the two fixing supports 410 to the fan 200, and they are less prone to misalignment, ensuring a stability and solidity of the fan support.

Figure 14:
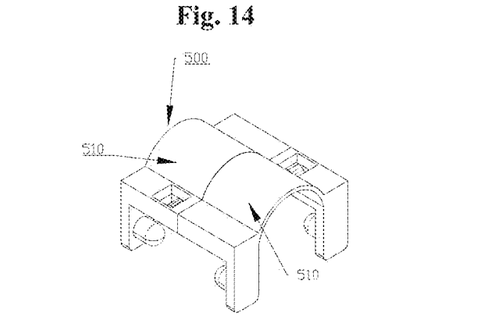
FIG. 14 is a top three-dimensional view of a pressing assembly according to an embodiment of the present disclosure.
Figure 15:
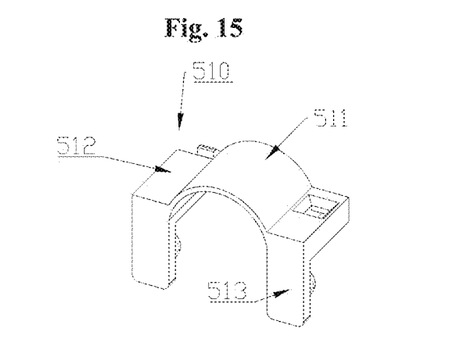
FIG. 15 is a top outer three-dimensional view of an elastic pressing piece according to an embodiment of the present disclosure.
Figure 16:
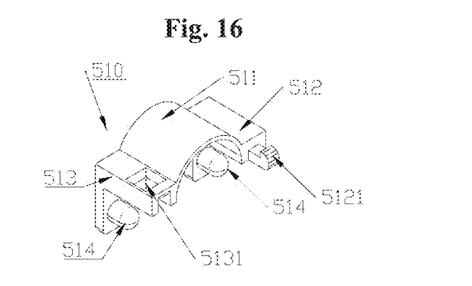
FIG. 16 is a top inner three-dimensional view of an elastic pressing piece according to an embodiment of the present disclosure.

In some embodiments, as shown in FIGS. 14-16, the pressing assembly 500 includes two elastic pressing pieces 510 having the same structure.

Figure 17:
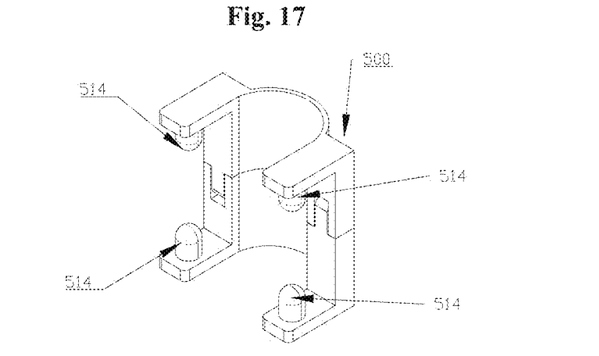
FIG. 17 is a bottom three-dimensional view of a pressing assembly according to an embodiment of the present disclosure.

As shown in FIGS. 7, 11 and 17, each of the two elastic pressing pieces 510 includes an elastic curved surface 511 which is bent in the vertical direction, a first support frame 512 and a second support frame 513 are respectively fixed on two opposite ends of the elastic curved surface 511, the horizontal rod 313 is provided with a first mounting groove 314 for mounting the first support frame 512 or the second support frame 513, the top plate 412 is provided with two second mounting grooves 416 for mounting the first support frame 512 and the second support frame 513, and release pins 514 are fixed on both of the first support frame 512 and the second support frame 513, the elastic curved surface 511 is made of a plastic sheet, a thin iron sheet, a copper sheet, or the like.

Sides of the two elastic pressing pieces 510 with the release pins 514 are arranged opposite each other, and each of the release pins 514 is inserted into the release pin movable groove 413, in respond to the elastic curved surface 511 being pressed, the release pins 514 abut against one of the two second connecting rods 3132 on an end portion of each horizontal rod 313.

In the embodiment, two symmetrically arranged elastic pressing pieces 510 are provided to share external pressure, and then four release pins 514 respectively move outwards inside the two release pin movable grooves 413 to abut against the end portions of four second connecting rods 3132 to smoothly push away the vertical rods 311, so that the external pressure is evenly distributed to two sides, thereby ensuring that the snap fit members smoothly disengage from the slots.

In some embodiments, a first support frame 512 is provided with a second elastic snap fit member 5121, a second support frame 513 is provided with a second elastic slot 5131, and the second elastic snap fit member 5121 of one of the two elastic pressing pieces 510 is snap-fitted in the second elastic slot 5131 of the other of the two elastic pressing pieces 510.

In the embodiment, the two elastic pressing pieces 510 are snap-fitted in each other, and are able to be assembled or disassembled without the need for assembly and disassembly tools, facilitating replacement and maintenance.

In some embodiments, referring to FIGS. 4-5 again, the fan support further includes a rubber pad 600. The rubber pad 600 is provided at a position where the fan 200 is in contact with the server case base 100. The rubber pad 600 is fixed to a bottom of the fan housing or the server case base 100.

In the embodiment, the rubber pad 600 is arranged to ensure that the fan and the base plate are not easy to deform when the fan is disassembled and assembled, effectively buffering the vibration and pressure when the fan support is pressed to unlock, and having a better shock absorption effect.

Figure 18:
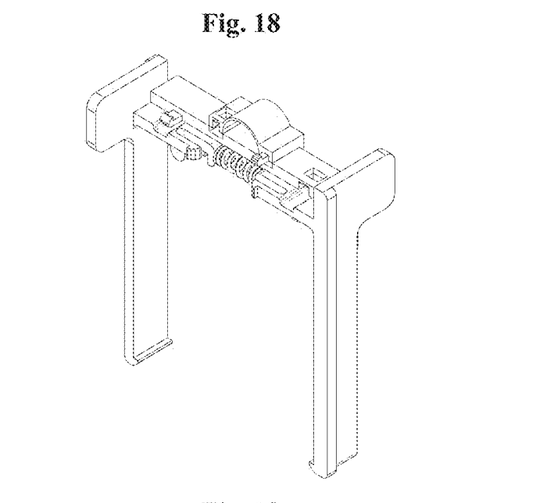
FIG. 18 is a top three-dimensional view of a fan support according to an embodiment of the present disclosure, with the fan, and the fixing support and elastic pressing piece on the same side concealed.
Figure 19:
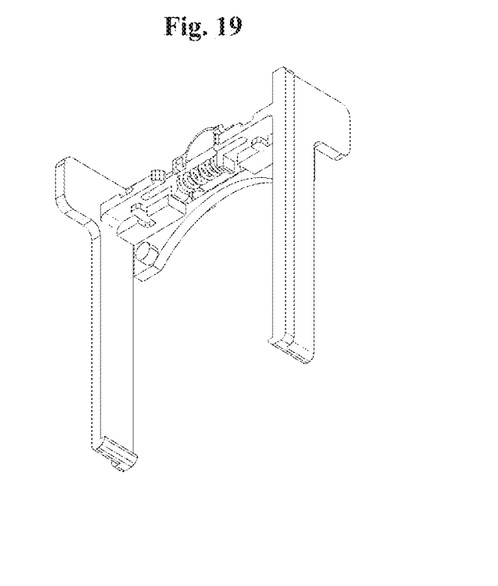
FIG. 19 is a bottom three-dimensional view of a fan support according to an embodiment of the present disclosure, with the fan, and the fixing support and elastic pressing piece on the same side concealed.

In still another embodiment, referring to FIGS. 5, 18 and 19, the following will provide the explanations from two aspects, an assembly of the fan support and a use of the fan support:

(I) Assembly of the fan support:
    step 1, placing the spring on the mounting pins 3133 of the two side arms 310;

step 2: aligning the alignment grooves 4151 and the alignment pins 4152 of the two symmetrical fixing supports 410 with each other;

step 3, after aligning the limiting posts 414 of the two symmetrical fixing supports 410 with the mounting through holes 210 of the fan housing, snapping fit the two fixing supports 410;

step 4: inserting the four release pins 514 of the two elastic pressing pieces 510 into the release pin movable grooves 413 of the two symmetrical fixing supports 410, and then mutually snapping fit the two elastic pressing pieces 510.

(II) Use of the Fan Support step 1, pressing the elastic curved surfaces 511 of the two elastic pieces 510 to enable the release pins 514 to move towards both sides, so that after the release pins 514 apply force to the four second connecting rods 3132 on the two side arms 310 to perform releasing, the spring expands to push the horizontal rods 313 on the two sides outwards until the limiting blocks 3134 engage with the guide plates 415 of the two fixing supports 410, and then the unlocking is completed; at this time, the structure as shown in FIG. 5 is able to be removed from the server base;

step 2, after placing the structure shown in FIG. 5 on the shock absorption rubber pad 600, pressing the handles 315 on the upper portions of the two side arms 310 inwards so that the end portions of the four second connecting rods 3132 push the four release pins 514 of the elastic pressing pieces 510 to move inwards along the release pin movable grooves 413 to deform and restore the elastic curved surfaces 511, and at this time, the snap fit members 312 are snap-fitted in the slots of the sever case base so that the fan is locked and fixed.

Figure 20:
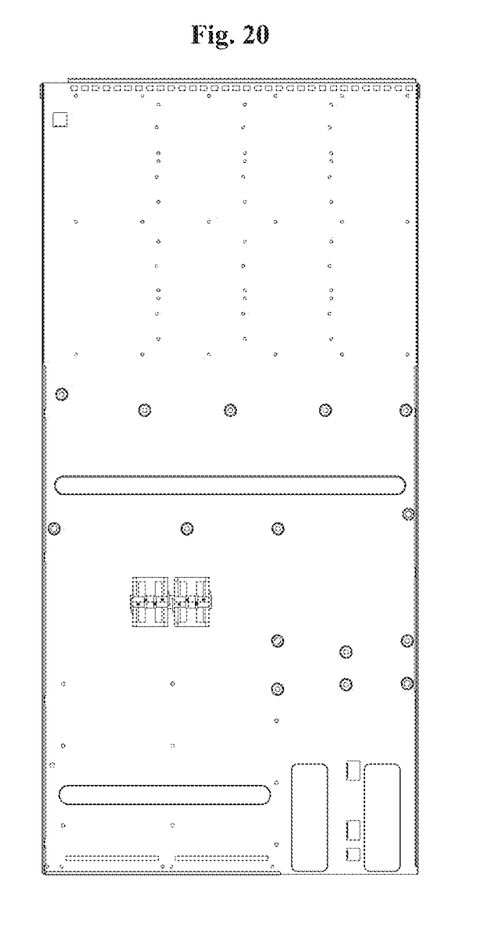
FIG. 20 is a top view of a server case using a fan support of the present disclosure according to an embodiment of the present disclosure.

In addition, as shown in FIG. 20, the operations on the fixing supports 410 and the elastic pressing pieces 510 are all located above the fan, which not only avoids obstructing the airflow path, but also ensures that the required operating space is above the fan; and when the fan is assembled and disassembled, only a small range of motion to both sides is required for the sidewalls to complete the assembling and disassembling.

The fan support free of assembly and disassembly tools, is easy to mount, has a low labor cost, increases the convenience of system maintenance, exhibits high versatility for wide application, does not require metal supports, fan rivets and blind rivets, and reduces costs, does not obstruct the airflow path of the fan, contributes to improving the dissipation performance of a server, and has a shock-absorbing function.

Various technical features of the foregoing embodiments may be combined in any way, and for brevity of description, not all possible combinations of the technical features in the foregoing embodiments are described. However, as long as combinations of these technical features are not contradictory, all these technical features should be considered to belong to the scope of the description.

The foregoing embodiments merely express several implementations of the present disclosure, and are described in detail. However, the embodiments shall not be construed to limit the scope of the present disclosure. It should be noted that, for a person skilled in the art, various modifications and improvements can be made without departing from the concept of the present disclosure, and all these modifications and improvements belong to the scope of protection of the present disclosure. Therefore, the scope of protection of the present disclosure should be determined by the appended claims.

The invention claimed is:

1. A fan support free of assembly and disassembly tools, comprising:
    a slot, there are two left-right symmetrical slots, and the two slots are both provided on a server case base, and the two slots are respectively located on left and right sides of a fan;
    an elastic arm assembly, the elastic arm assembly comprises two side arms which are left-right symmetrical and vertically arranged, and an elastic member, the two side arms are respectively located on left and right sides of the fan, bottoms of the two side arms are bent inwards to form bending regions, the two bending regions are respectively snap-fitted in the two slots, tops of the two side arms are connected by the elastic member;
    a fixing assembly, the fixing assembly is provided with a limiting structure that fits with a mounting through hole on a top of a fan housing, and the fixing assembly is further provided with a sliding groove along a width direction of the fan; and
    a pressing assembly, the pressing assembly is provided with a deformable region, and a sliding structure that fits with the sliding groove, the deformable region is configured to drive the sliding structure to move outwards in the sliding groove in respond to being subjected to an external force, and the sliding structure pushes the elastic member to stretch and deform, so that a distance between the two side arms increases to drive the bending regions of the two side arms to disengage from the two slots.

2. The fan support free of assembly and disassembly tools according to claim 1, wherein each of the two slots comprises a rectangular through hole provided on the server case base, a baffle is provided on an inner side of the rectangular through hole, and the baffle is bent towards a side where the fan is located to cover the rectangular through hole.

3. The fan support free of assembly and disassembly tools according to claim 1, wherein each of the two side arms comprises a vertical rod, a snap fit member and a horizontal rod; and
    the vertical rod is arranged along the vertical direction, the snap fit member is fixed on an inner side of a bottom of the vertical rod, and the horizontal rod is fixed on an inner side of a top of the vertical rod and extends along the width direction of the fan.

4. The fan support free of assembly and disassembly tools according to claim 3, wherein a first connecting rod located in a middle and two second connecting rods located on both sides are arranged side by side on an end portion of the horizontal rod away from the vertical rod, a mounting pin is fixed on an end portion of the first connecting rod, and each end of the elastic member is fixed on the mounting pin corresponding to the horizontal rod of each of the two side arms.

5. The fan support free of assembly and disassembly tools according to claim 4, wherein the fixing assembly comprises two fixing supports having the same structure;
    each of the two fixing supports comprises a side plate and a top plate which are perpendicular to each other, a lower portion of the side plate is provided with an arcuate notch, a release pin movable groove along the width direction of the fan is provided above the arcuate notch on the side plate, limiting posts are fixed on the same side of the side plate as the top plate and are located on both sides of the arcuate notch, and each of the limiting posts is inserted into the mounting through hole on the top of the fan housing; and sides of the two fixing supports with the limiting posts are arranged opposite each other, both ends of the top plate are respectively provided with a first elastic slot and a first elastic snap fit member, and the first elastic snap fit member of one of the two fixing supports is snap-fitted in the first elastic slot of the other of the two fixing supports.

6. The fan support free of assembly and disassembly tools according to claim 5, wherein each of the two fixing supports further comprises two guide plates arranged symmetrically on left and right sides, the two guide plates are fixed on the side plate and are parallel to the top plate, a side edge of the horizontal rod is embedded between the two guide plates and the top plate, and a front end of the first connecting rod is bent downwards to form a limiting block; and a lower edge of a side, away from the side plate, of one of the two guide plates is provided with an alignment groove recessed relative to an edge of one of the two guide plates, an alignment pin protruding relative to the edge of one of the two guide plates is arranged above the alignment groove, an upper edge of a side, away from the side plate, of the other of the two guide plates is provided with the alignment groove recessed relative to an edge of the other of the two guide plates, the alignment pin protruding relative to the edge of the other of the two guide plates is provided below the alignment groove, and the alignment pin and the alignment groove have the same length and width.

7. The fan support free of assembly and disassembly tools according to claim 5, wherein the pressing assembly comprises two elastic pressing pieces having the same structure;

each of the two elastic pressing pieces comprises an elastic curved surface which is bent towards the vertical direction, a first support frame and a second support frame are respectively fixed on two opposite ends of the elastic curved surface, the horizontal rod is provided with a first mounting groove for mounting the first support frame or the second support frame, the top plate is provided with two second mounting grooves for mounting the first support frame and the second support frame, and release pins are fixed on both of the first support frame and the second support frame; and sides of the two elastic pressing pieces with the release pins are arranged opposite each other, and each of the release pins is inserted into the release pin movable groove, in respond to the elastic curved surface being pressed, the release pins abut against one of the two second connecting rods on an end portion of the horizontal rod.

8. The fan support free of assembly and disassembly tools according to claim 7, wherein the first support frame is provided with a second elastic snap fit member, the second support frame is provided with a second elastic slot, and the second elastic snap fit member of one of the two elastic pressing pieces is snap-fitted in the second elastic slot of the other of the two elastic pressing pieces.

9. The fan support free of assembly and disassembly tools according to claim 7, wherein the elastic curved surface is made of a plastic sheet, a thin iron sheet, or a copper sheet.

10. The fan support free of assembly and disassembly tools according to claim 3, wherein each of the two side arms further comprises a handle, and the handle is provided on an upper portion of the vertical rods.

11. The fan support free of assembly and disassembly tools according to claim 1, wherein the elastic member is a compression spring.

12. The fan support free of assembly and disassembly tools according to claim 1, wherein the fan support further comprises a rubber pad, the rubber pad is arranged at a position where the fan is in contact with the server case base, and the rubber pad is fixed to a bottom of the fan housing or the server case base.

13. The fan support free of assembly and disassembly tools according to claim 2, wherein the fan support further comprises a rubber pad, the rubber pad is arranged at a position where the fan is in contact with the server case base, and the rubber pad is fixed to a bottom of the fan housing or the server case base.

14. The fan support free of assembly and disassembly tools according to claim 3, wherein the fan support further comprises a rubber pad, the rubber pad is arranged at a position where the fan is in contact with the server case base, and the rubber pad is fixed to a bottom of the fan housing or the server case base.

15. The fan support free of assembly and disassembly tools according to claim 4, wherein the fan support further comprises a rubber pad, the rubber pad is arranged at a position where the fan is in contact with the server case base, and the rubber pad is fixed to a bottom of the fan housing or the server case base.

16. The fan support free of assembly and disassembly tools according to claim 5, wherein the fan support further comprises a rubber pad, the rubber pad is arranged at a position where the fan is in contact with the server case base, and the rubber pad is fixed to a bottom of the fan housing or the server case base.

17. The fan support free of assembly and disassembly tools according to claim 6, wherein the fan support comprises a rubber pad, the rubber pad is arranged at a position where the fan in is contact with the server case base, and the rubber pad is fixed to a bottom of the fan housing or the server case base.

18. The fan support of assembly and disassembly tools according to claim 7, wherein the fan support further comprises a rubber pad, the rubber pad is arranged at a position where the fan is in contact with the server case base, and the rubber pad is fixed to a bottom of the fan housing or the server case base.

19. The fan support of assembly and disassembly tools according to claim 8, wherein the fan support further comprises a rubber pad, the rubber pad is arranged at a position where the fan is in contact with the server case base, and the rubber pad is fixed to a bottom of the fan housing or the server case base.

20. The fan support of assembly and disassembly tools according to claim 9, wherein the fan support further comprises a rubber pad, the rubber pad is arranged at a position where the fan is in contact with the server case base, and the rubber pad is fixed to a bottom of the fan housing or the server case base.

* * * * *